(12) United States Patent
Pei et al.

(10) Patent No.: US 7,517,739 B2
(45) Date of Patent: Apr. 14, 2009

(54) PRINTED ELECTRONIC DEVICE AND TRANSISTOR DEVICE AND MANUFACTURING METHOD THEREOF

(75) Inventors: Zing Way Pei, Taichung (TW); Chao An Chung, Hsinchu (TW)

(73) Assignee: Industrial Technology Research Institute, Hsinchu County (TW)

( * ) Notice: Subject to any disclaimer, the term of this patent is extended or adjusted under 35 U.S.C. 154(b) by 0 days.

(21) Appl. No.: 11/531,277

(22) Filed: Sep. 12, 2006

(65) Prior Publication Data

US 2008/0029848 A1 Feb. 7, 2008

(30) Foreign Application Priority Data

Aug. 2, 2006 (TW) ............................... 95128244 A

(51) Int. Cl.
*H01L 21/00* (2006.01)
(52) U.S. Cl. .................... 438/149; 438/158; 438/161
(58) Field of Classification Search ................. 438/149, 438/151, 158, 161, 163, 164
See application file for complete search history.

(56) References Cited

U.S. PATENT DOCUMENTS

| 5,753,541 A | * | 5/1998 | Shimizu | 438/161 |
|---|---|---|---|---|
| 6,391,691 B1 | * | 5/2002 | Tsujimura et al. | 438/151 |
| 6,410,411 B1 | * | 6/2002 | McGarvey et al. | 438/592 |
| 6,517,995 B1 | * | 2/2003 | Jacobson et al. | 430/320 |
| 6,875,704 B2 | * | 4/2005 | Baek et al. | 438/743 |
| 7,238,557 B2 | * | 7/2007 | Hayakawa | 438/161 |
| 2003/0059987 A1 | | 3/2003 | Sirringhaus et al. | |
| 2004/0175963 A1 | | 9/2004 | Cain et al. | |
| 2005/0266693 A1 | * | 12/2005 | Maekawa | 438/720 |

FOREIGN PATENT DOCUMENTS

WO  WO2004/055919 A3  7/2006

* cited by examiner

*Primary Examiner*—Kevin M Picardat
(74) *Attorney, Agent, or Firm*—WPAT P.C.; Anthony King

(57) ABSTRACT

An electronic device, e.g., a printed transistor device, comprises a substrate, a first conductive layer, a second conductive layer and a semiconductor layer. The substrate has a first platform and a second platform embossing on the surface thereof, and the first and second platforms are separated by a gap whose width is equivalent to the channel length of the transistor. The first and second conductive layers serving as the source and the drain, respectively, of the transistor device are formed on surfaces of the first and second platforms. The semiconductor layer is formed on the surface of the substrate in the gap.

19 Claims, 3 Drawing Sheets

PRINTED ELECTRONIC DEVICE AND TRANSISTOR DEVICE AND MANUFACTURING METHOD THEREOF

BACKGROUND OF THE INVENTION (A) Field of the Invention

The present invention is related to an electronic device, a transistor device and manufacturing methods thereof, and more specifically, to a printed electronic device, a printed transistor device and manufacturing methods thereof.

(B) Description of the Related Art

With the downsizing of electronic devices, because of natural limitations of light and requirement of high energy radiation, photolithography processes need more complicated and sophisticated equipment and techniques for the application of nanometer patterns. Consequently, there are shortcomings of high cost of equipment and high risk techniques. Domestic or international industrial and research fields all invest considerable capital and manpower in developing nanometer processes, intending to develop lower cost and more reliable techniques to meet the demand of equipment and technique for mass production of nanometer devices. However, for the lithography and etching processes, the costly reticle and equipment are still obstacles for entering the generation of 50 nm semiconductor processes.

Printing technique is convenient and simple, and can be performed by printing or transferring a pattern many times via a single mold. Printing is an additive process, so the waste of material can be significantly reduced. Besides, patterning for a large area can be subjected to printing for decreasing the cost.

The requirement of high speed of a printed transistor device can be accomplished by the following methods: (1) use semiconductor material of higher carrier mobility; (2) shorten the distance of source and drain of the transistor; or (3) use higher voltage.

The use of semiconductor material of higher carrier mobility is limited to the nature of the material itself, and thus the room for improvement is limited also. The use of high voltage cannot meet the requirements for the device of smaller line width of design rule as with the increase of circuit integrity. Consequently, shortening the distance between the source and drain becomes a solution in practice. It is important to associate with printing technique to obtain a transistor device of low cost and high resolution for current research and development.

U.S. Patent Publication No. 2004/0175963A1 and 2003/0059987A1 use either the characteristics of hydrophilic and hydrophobic or a barrier built in advance for ink printing, so as to fabricate the source and drain of the semiconductor transistor device.

WO 2004/055919 disclosed another method for fabricating a transistor device. Referring to FIGS. 1(a) and 1(b), two recesses 3 and 4 are formed in a substrate 1 by being pressed with a press mold 2, and are separated by a barrier 5. Then, a stamp 6 inked with a hydrophobic surface modifier 7 is pressed to contact the substrate 1, and thus the surface of the substrate 1 excluding the recesses 3 and 4 is daubed with the surface modifier 7 as shown in FIGS. 1(c) and 1(d). Referring to FIG. 1(e), because the surface modifier 7 is hydrophobic, conductive ink 8 only remains in the recesses 3 and 4 and forms a source 9 and a drain 10 when performing ink-printing. Sequentially, a semiconductor layer 11 and a dielectric layer 12 are formed on the surfaces of the source 9 and drain 10 in sequence, and a gate 13 is formed in the dielectric layer 12, by which a printed transistor device is formed as shown in FIG. 1(f).

The above known methods need to utilize hydrophilic and hydrophobic characteristics or use a barrier separating the recesses for the formations of the source and drain; thus the process is complicated and the manufacturing flexibility is decreased.

SUMMARY OF THE INVENTION

The objective of the present invention is to provide an electronic device, e.g., a transistor, which is fabricated by printing technique to obtain a superior printing resolution, e.g., less than 10 µm, so that the distance between the source and the drain of the transistor can be exactly defined and low manufacturing cost can be achieved also.

To achieve the above objective, the present invention discloses a printed electronic device, e.g., a printed transistor device, comprising a substrate, a first conductive layer, a second conductive layer and a semiconductor layer. The substrate comprises a first platform and a second platform embossing on the surface thereof, and the first and second platforms are separated by a gap whose width is equivalent to the channel length of the printed transistor device. The first and second conductive layers serving as the source and the drain of the transistor are formed on surfaces of the first and second platforms. The semiconductor layer is formed on the first and second conductive layers and a surface of the substrate in the gap.

The above-mentioned printed transistor device can be fabricated by the following steps. First, a substrate is pressed to form a first platform and a second platform separated by a gap. Next, the surfaces of the first and second platforms are ink-printed to form a first conductive layer and a second conductive layer thereon, and the first and second conductive layers serve as the source and drain of the printed transistor device. Sequentially, a semiconductor layer is formed on the first conductive layer, the second conductive layer and a surface of the substrate in the gap.

The present invention uses pressing technique to form two embossing platforms separated by a gap, and prints the source and drain on the two platforms of the substrate. It is not only simple but also can precisely define the distance between the source and drain of the transistor device, thereby the printed transistor device will have a resolution less than 50 µm, or even less than 10 µm. Consequently, a transistor device with low cost and high resolution can be obtained.

DETAILED DESCRIPTION OF THE INVENTION

The present invention will be explained with the appended drawings to clearly disclose the technical characteristics of the present invention.

FIGS. 2(a) through 2(e) illustrate a method for manufacturing a printed electronic device, e.g., a printed transistor device 20, in accordance with an embodiment of the present invention.

Figure 1A:
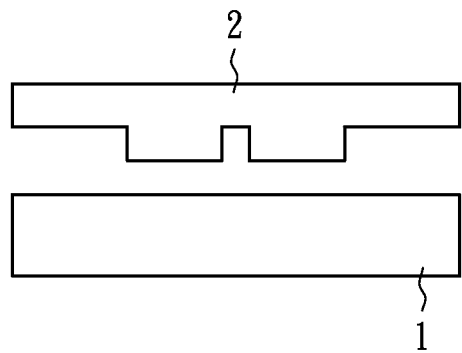
FIGS. 1(a) through 1(f) illustrate a known method for manufacturing a printed transistor device.
Figure 1B:
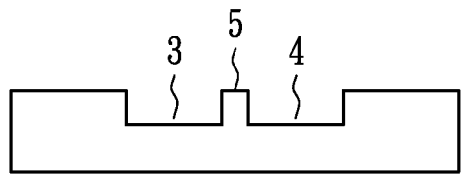
Figure 1C:
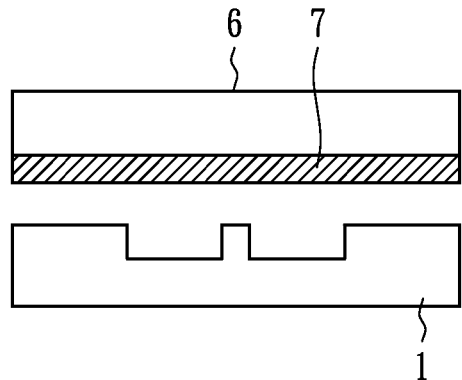
Figure 1D:
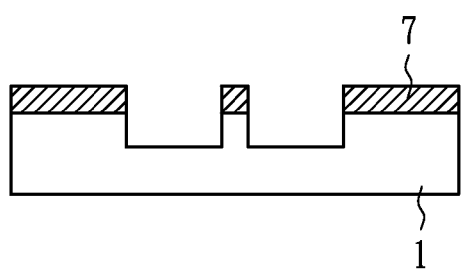
Figure 1E:
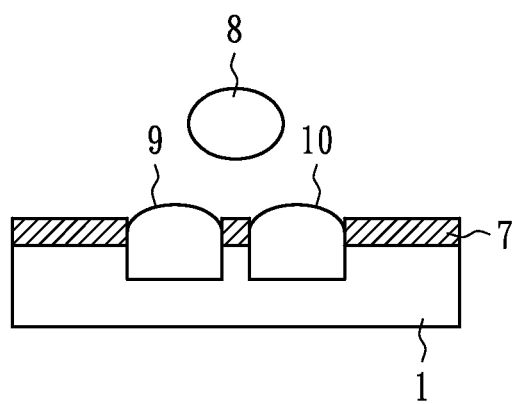
Figure 1F:
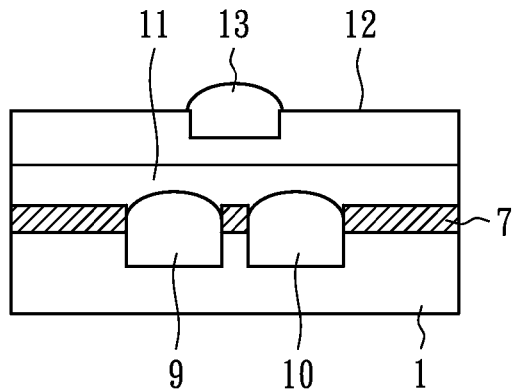
Figure 2A:
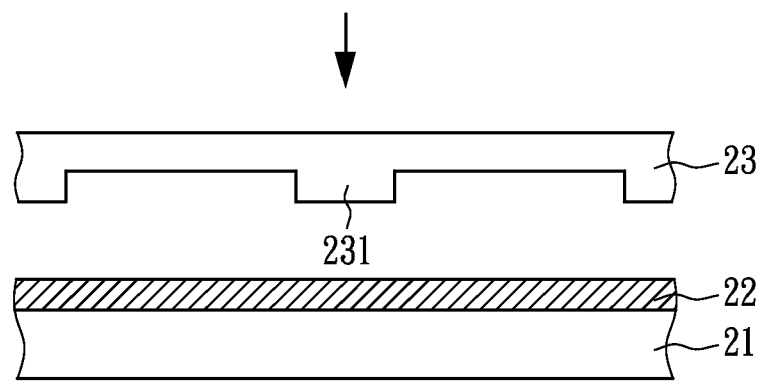
FIGS. 2(a) through 2(e) illustrate a method for manufacturing a printed electronic device (transistor) in accordance with an embodiment of the present invention.
Figure 2B:
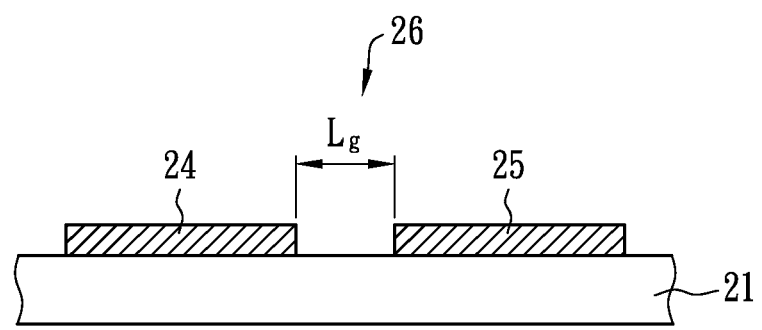

Referring to FIG. 2(a), a dielectric layer 22 is formed on a substrate 21. The substrate 21 can be made of glass or plastic, and the dielectric layer is made by polymer solution, or preferably made by polymer gel. Then, the dielectric layer 22 is pressed by a mold 23 having a protrusion portion 231, so as to form a first platform 24 and a second platform 25 separated by a gap 26. The width of the protrusion portion 231 is equivalent to the width Lg of the gap 26 as shown in FIG. 2(b). The width of the protrusion portion 231 can be precisely made to be less than 50 μm or 10 μm, so as to precisely define the width Lg of the gap 26. The pressing process can be performed after curing the dielectric layer 22 or during the period of curing the dielectric layer 22. For example, pressing accompanied by ultraviolet curing, or directly pressed by the mold 23 after curing. Moreover, the first and second platforms 24 and 25 can be formed in the substrate 21 directly, i.e., the step of forming the dielectric layer 22 on the surface of the substrate 21 can be omitted.

Figure 2C:
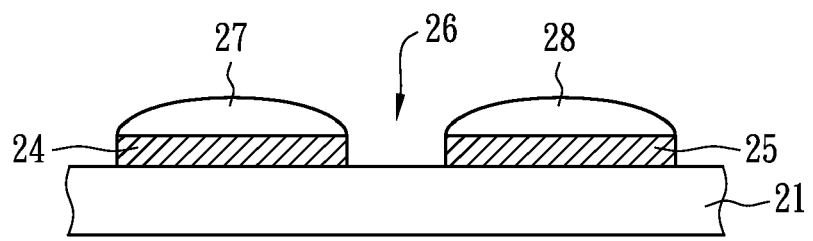
Figure 2D:
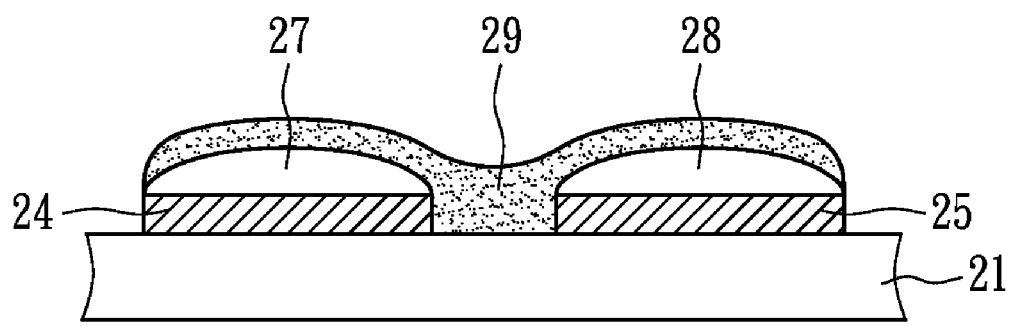

Referring to FIG. 2(c), conductive layers 27 and 28 are respectively formed on the surfaces of the first and second platforms 24 and 25 by printing conductive ink thereon. The conductive ink forming the conductive layers 27 and 28 can be conductive polymer or selected from the group consisting of metal paste of gold, silver or copper. Preferably, the substrate 1 can be soaked with a surface modifier, e.g., a hydrophilic surface modifier, before printing the conductive layers 27 and 28, so as to improve the contact properties between the conductive material, i.e., conductive ink, and the first and second platforms 24 and 25. Sequentially, a semiconductor layer 29 is formed on the surface of the first and second platforms 24 and 25 and a surface of the substrate 21 in the gap 26 as shown in FIG. 2(d). The semiconductor layer 29 preferably uses soluble (solution) semiconductor material, or organic semiconductor material, and can be formed by deposition or spin-coating.

Figure 2E:
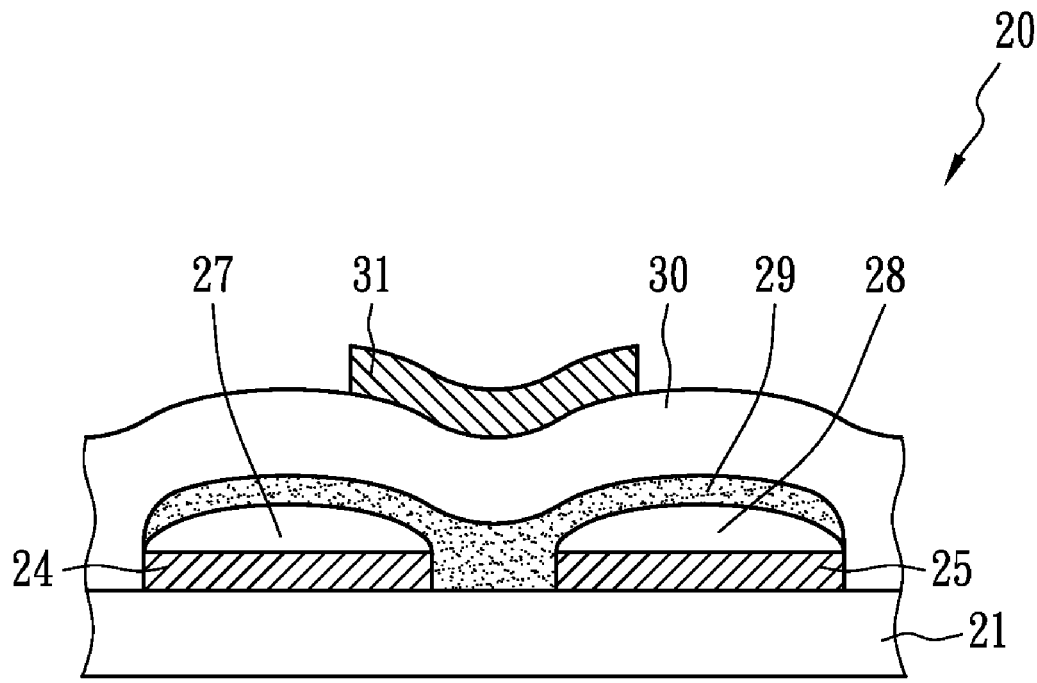

Referring to FIG. 2(e), another dielectric layer 30 is formed on the surface of the semiconductor layer 29, and a conductive layer is formed on the surface of the dielectric layer 30 and patterned to be a third conductive layer 31, so as to form the printed transistor device 20 of the present invention.

The conductive layers 27 and 28 serve as the source and the drain, respectively, of the printed transistor device 20. The width of the gap 26 is equivalent to the channel length of the transistor device 20, i.e., the distance between the source and the drain. The third conductive layer 31 serves as the gate of the transistor device 20.

In comparison with prior arts, utilizing hydrophilic and hydrophobic characteristics or a physical barrier separating the recesses for the formations of the source and drain, the present invention using pressing technique to form two platforms separated by a gap is not only simple but also can precisely define the distance between the source and drain of the transistor device; thereby the transistor device will have a resolution less than 50 μm, or even less than 10 μm. Consequently, a transistor device with low cost and high resolution can be obtained.

The above-described embodiments of the present invention are intended to be illustrative only. Numerous alternative embodiments may be devised by those skilled in the art without departing from the scope of the following claims.

What is claimed is:

1. A method for manufacturing a printed electronic device, comprises:
   providing a substrate;
   pressing the substrate to form a first platform and a second platform on the surface thereof, the first and second platforms being separated by a gap;
   forming a dielectric layer on a surface of the substrate;
   pressing the dielectric layer to form the first platform and second platform;
   printing the first platform and the second platform to form a first conductive layer and a second conductive layer thereon, wherein the first and second platforms and the first and second conductive layers are vertically aligned; and
   forming a semiconductor layer on a surface of the substrate in the gap.

2. The method for manufacturing a printed electronic device in accordance with claim 1, wherein the printed electronic device is a printed transistor device, and the first and second conductive layers serve as the source and the drain, respectively, of the printed transistor device.

3. The method for manufacturing a printed electronic device in accordance with claim 1, wherein a curing process is performed while pressing the dielectric layer.

4. The method for manufacturing a printed electronic device in accordance with claim 1, further comprising a step of soaking surface modifier onto the first and the second platforms to facilitate the printing of the first and second conductive layers.

5. The method for manufacturing a printed electronic device in accordance with claim 1, wherein the first and second conductive layers are printed by conductive ink.

6. The method for manufacturing a printed electronic device in accordance with claim 1, wherein the semiconductor layer is formed by deposition or spin-coating.

7. The method for manufacturing a printed electronic device in accordance with claim 1, wherein the semiconductor layer comprises soluble semiconductor material.

8. The method for manufacturing a printed electronic device in accordance with claim 1, wherein the semiconductor layer comprises organic semiconductor material.

9. The method for manufacturing a printed electronic device in accordance with claim 2, further comprising the steps after the formation of the semiconductor layer:
   forming a dielectric layer on a surface of the semiconductor layer; and
   forming a third conductive layer on a surface of the dielectric layer above the gap, the third conductive layer serving as the gate of the printed transistor device.

10. The method for manufacturing a printed electronic device in accordance with claim 1, wherein the first and second platforms are pressed by a mold having a protrusion whose width is equivalent to the width of the gap.

11. A method for manufacturing a printed transistor device, comprises:
   providing a substrate;
   pressing the substrate to form a first platform and a second platform on the surface thereof, the first and second platforms being separated by a gap;
   forming a dielectric layer on a surface of the substrate;
   pressing the dielectric layer to form the first platform and second platform;
   printing the first platform and the second platform to form a first conductive layer and a second conductive layer thereon, the first and second conductive layers serving as the source and the drain, respectively, of the printed transistor device, wherein the first and second platforms and the first and second conductive layers are vertically aligned; and
   forming a semiconductor layer on a surface of the substrate in the gap.

12. The method for manufacturing a printed transistor device in accordance with claim 11, wherein a curing process is performed while pressing the dielectric layer.

13. The method for manufacturing a printed transistor device in accordance with claim 11, further comprising a step of soaking surface modifier onto the first and the second platforms to facilitate the printing of the first and second conductive layers.

14. The method for manufacturing a printed transistor device in accordance with claim 11, wherein the first and second conductive layers are printed by conductive ink.

15. The method for manufacturing a printed transistor device in accordance with claim 11, wherein the semiconductor layer is formed by deposition or spin-coating.

16. The method for manufacturing a printed transistor device in accordance with claim 11, wherein the semiconductor layer comprises soluble semiconductor material.

17. The method for manufacturing a printed transistor device in accordance with claim 11, wherein the semiconductor layer comprises organic semiconductor material.

18. The method for manufacturing a printed transistor device in accordance with claim 11, further comprising steps after the formation of the semiconductor layer:
   forming a dielectric layer on a surface of the semiconductor layer; and
   forming a third conductive layer on a surface of the dielectric layer above the gap, the third conductive layer serving as the gate of the printed transistor device.

19. The method for manufacturing a printed transistor device in accordance with claim 11, wherein the first and second platforms are pressed by a mold having a protrusion whose width is equivalent to the width of the gap.

* * * * *